United States Patent
Sakai (10) Patent No.: US 8,604,349 B2
(45) Date of Patent: Dec. 10, 2013

(54) MULTILAYER SUBSTRATE AND MANUFACTURING METHOD THEREOF

(75) Inventor: Norio Sakai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 86 days.

(21) Appl. No.: 13/453,229

(22) Filed: Apr. 23, 2012

(65) Prior Publication Data

US 2012/0205145 A1 Aug. 16, 2012

Related U.S. Application Data

(63) Continuation of application No. PCT/JP2010/069797, filed on Nov. 8, 2010.

(30) Foreign Application Priority Data

Nov. 10, 2009 (JP) ................................. 2009-257185

(51) Int. Cl.
*H05K 1/03* (2006.01)
*H05K 1/00* (2006.01)
*H05K 1/11* (2006.01)

(52) U.S. Cl.
USPC ........................... 174/255; 174/258; 174/262

(58) Field of Classification Search
USPC ................................................ 174/255–266
See application file for complete search history.

(56) References Cited

U.S. PATENT DOCUMENTS

| | | | | |
|---|---|---|---|---|
| 6,440,542 | B1 * | 8/2002 | Kariya | 428/209 |
| 7,287,321 | B2 * | 10/2007 | Takeuchi et al. | 29/834 |
| 7,356,917 | B2 * | 4/2008 | Harada et al. | 29/831 |
| 2003/0173105 | A1 * | 9/2003 | Kondo et al. | 174/255 |
| 2003/0180510 | A1 * | 9/2003 | Ogawa et al. | 428/209 |
| 2006/0042078 | A1 | 3/2006 | Takeuchi et al. | |
| 2008/0136013 | A1 | 6/2008 | Kamiya et al. | |
| 2011/0042124 | A1 * | 2/2011 | Matsui et al. | 174/157 |

FOREIGN PATENT DOCUMENTS

| | | |
|---|---|---|
| JP | 2001-15921 A | 1/2001 |
| JP | 2002-305382 A | 10/2002 |
| JP | 2003-311500 A | 11/2003 |
| JP | 2004-127970 A | 4/2004 |
| JP | 2004-152782 A | 5/2004 |
| JP | 2006-73763 A | 3/2006 |
| JP | 2006-210533 A | 8/2006 |
| JP | 2007-53197 A | 3/2007 |
| JP | 2007-109697 A | 4/2007 |
| JP | 2008-147254 A | 6/2008 |

OTHER PUBLICATIONS

Official Communication issued in International Patent Application No. PCT/JP2010/069797, mailed on Feb. 8, 2011.

* cited by examiner

*Primary Examiner* — Jeremy Norris
(74) *Attorney, Agent, or Firm* — Keating & Bennett, LLP (57) ABSTRACT

A multilayer substrate includes a plurality of stacked thermoplastic resin layers each including an in-plane conductive pattern provided on one principal surface thereof and an interlayer conductive portion arranged to penetrate through the thermoplastic resin layer in a thickness direction. The plurality of thermoplastic resin layers include a first thermoplastic resin layer and a second thermoplastic resin layer, a stacking direction of which is inverted with respect to a stacking direction of the first thermoplastic resin layer. The second thermoplastic resin layer is thicker than the first thermoplastic resin layer. One end in the thickness direction of the interlayer conductive portion provided in the second thermoplastic resin layer is connected with the interlayer conductive portion of the thermoplastic resin layer adjacent to the second thermoplastic resin layer in the thickness direction such that the in-plane conductive pattern is not interposed therebetween.

12 Claims, 11 Drawing Sheets

MULTILAYER SUBSTRATE AND MANUFACTURING METHOD THEREOF

BACKGROUND OF THE INVENTION

1. Field of the Invention

The present invention relates to a multilayer substrate and a manufacturing method thereof.

2. Description of the Related Art

An example of a multilayer substrate and a manufacturing method thereof is described in Japanese Unexamined Patent Application Publication No. 2008-147254. As described in Japanese Unexamined Patent Application Publication No. 2008-147254, a method of manufacturing a multilayer substrate by stacking a plurality of resin films made of thermoplastic resin is known. Each of the resin films has a conductive pattern provided on a principal surface of the multilayer substrate. Each of the resin films includes a hole. A hole penetrates through the resin film in the thickness direction at a position corresponding to the conductive pattern on the principal surface. The hole is filled with conductive paste, thereby providing a conductive portion penetrating through the resin film in the thickness direction. The conductive portion penetrating through the resin film in the thickness direction is tapered.

Figure 32:
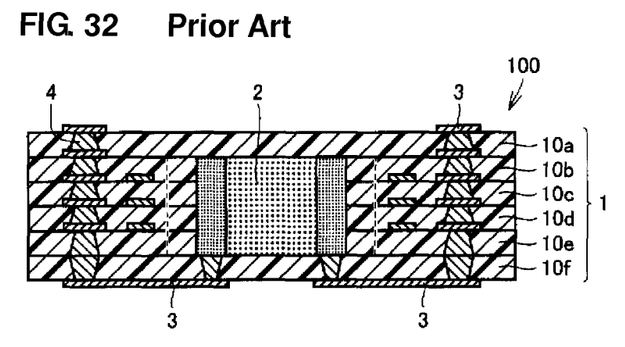
FIG. 32 is a cross-sectional view of a multilayer substrate according to the related art.

FIG. 32 illustrates the multilayer substrate described in Japanese Unexamined Patent Application Publication No. 2008-147254. The multilayer substrate 100 includes an insulated substrate 1 formed by stacking resin films 10a, 10b, 10c, 10d, 10e, and 10f. An electronic component 2 is disposed in the multilayer substrate 100 such that the electronic component 2 is wrapped in the insulated substrate 1. Each of the resin films includes a conductive pattern 3 on only one of principal surfaces. Each of the resin films includes a conductive portion 4 therein to penetrate through the resin film in the thickness direction. The conductive portion 4 is arranged within a region where the conductive pattern 3 extends. The conductive portion 4 is tapered in cross section. The narrow side is connected with the conductive pattern 3. Thus, in a single resin film, the wide side of the conductive portion 4 is exposed at another principal surface without the conductive pattern 3.

Referring to FIG. 32, the resin films 10a, 10b, 10c, 10d, and 10e are stacked in the multilayer substrate 100 such that the conductive patterns 3 are arranged at the upper sides. Only the resin film 10f is stacked such that the conductive pattern 3 is arranged at the lower side, such that the conductive pattern 3 is exposed at the lowermost surface of the multilayer substrate 100. As described above, the stacking direction of only the resin film 10f is inverted. The conductive pattern 3 is not present between the resin film 10e and the resin film 10f.

Each resin film includes the conductive pattern on only one of the principal surfaces inevitably for the convenience of the manufacturing method. The conductive portion 4 is tapered because the hole is made by laser processing from the surface not including the conductive pattern 3 of each resin film.

A mount land electrode must be provided on the upper surface of the multilayer substrate for mounting a surface mount device (also referred to as "SMD") and an integrated circuit (also referred to as "IC") on the upper surface, and a land electrode must be provided on the lower surface of the multilayer substrate for mounting the multilayer substrate itself on a motherboard or the other components. In general, when a multilayer substrate is formed by stacking resin films, the stacking direction of either of the uppermost and lowermost resin films must be inverted to cause conductive patterns to be exposed at both of the uppermost and lowermost surfaces.

In the multilayer substrate described above, the conductive portion 4 of the resin film 10e is directly connected with the conductive portion 4 of the resin film 10f such that the conductive pattern 3 is not interposed therebetween as shown in FIG. 32. However, a connection failure may occur at the connection position between the conductive portions 4.

SUMMARY OF THE INVENTION

To overcome the problems described above, preferred embodiments of the present invention provide a multilayer substrate and a manufacturing method thereof that reduces the occurrence of a connection failure between conductive portions of respective resin layers at an interface at which the resin layers are arranged in mutually inverted stacking directions and are in contact with each other.

A multilayer substrate according to a preferred embodiment of the present invention preferably includes a plurality of stacked thermoplastic resin layers each including an in-plane conductive pattern provided on one of principal surfaces and an interlayer conductive portion provided to penetrate through the thermoplastic resin layer in a thickness direction. The plurality of thermoplastic resin layers include a first thermoplastic resin layer and a second thermoplastic resin layer, a stacking direction of which is inverted with respect to a stacking direction of the first thermoplastic resin layer, the second thermoplastic resin layer being thicker than the first thermoplastic resin layer. One of the ends in the thickness direction of the interlayer conductive portion provided at the second thermoplastic resin layer is connected with the interlayer conductive portion of the thermoplastic resin layer adjacent to the second thermoplastic resin layer in the thickness direction such that the in-plane conductive pattern is not interposed therebetween.

With preferred embodiments of the present invention, the occurrence of a connection failure is reduced between the conductive portions of the respective resin layers at the interface at which the resin layers are arranged in the mutually inverted stacking directions and are in contact with each other.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The inventors of the present invention have considered the following reasons for the occurrence of a connection failure between the conductive portions of the respective resin layers at the interface at which the resin layers are arranged in the mutually inverted stacking directions and are in contact with each other as mentioned above.

Figure 1:
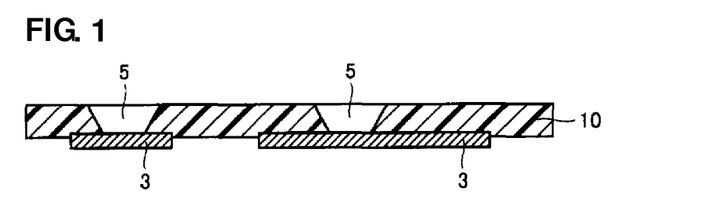
FIG. 1 is a cross-sectional view of a state after a resin film is processed by laser processing.
Figure 2:
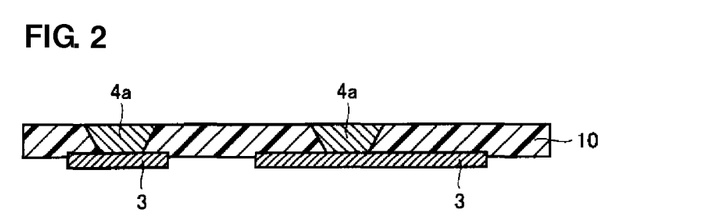
FIG. 2 is a cross-sectional view of a state after a through hole of the resin film is filled with a conductive material.
Figure 3:
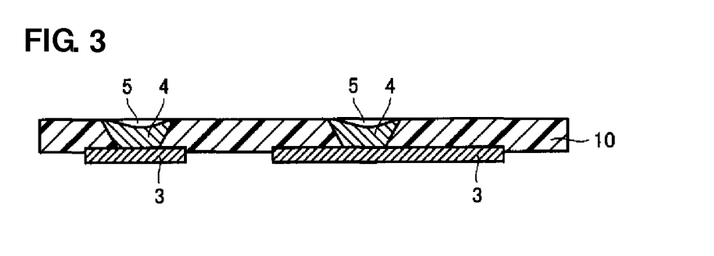
FIG. 3 is a cross-sectional view of a state after a conductive portion provided at the resin film is hardened and shrunk.

Each of the resin films included in the multilayer substrate shown in FIG. 32 includes the conductive portion 4. Laser processing is typically performed to form the conductive portion 4 in the resin film. Specifically, laser light is emitted on the surface without the conductive pattern 3, and as shown in FIG. 1, a tapered through hole 5 is provided at the resin film 10. The conductive pattern 3 is exposed at the bottom of the through hole 5. The through hole 5 of the resin film 10 is filled with conductive material paste by screen printing or the other methods, thereby providing a structure shown in FIG. 2. That is, a conductive portion 4a is formed. In this state, the structure is dried, if required. The conductive material used for the conductive portion 4a includes resin, such as epoxy resin or flux, for example, that is liquid in addition to metal components, by several percent to about 20% by volume, to increase printability, dispersibility, and wettability, and to harden the material so as to maintain its shape. The components included in the conductive portion 4a are partially evaporated through thermal history such as drying, laminating, and heat processing, and the conductive portion 4a itself is hardened and shrunk. Thus, the conductive portion 4a is changed to the conductive portion 4 shown in FIG. 3. When the conductive portion 4a becomes the conductive portion 4, the upper surface of the conductive portion 4 is recessed from than the upper surface of the resin film 10. The resin films 10 in such a state are stacked as shown in FIG. 32, heated and pressed, so as to be press-bonded.

Figure 4:
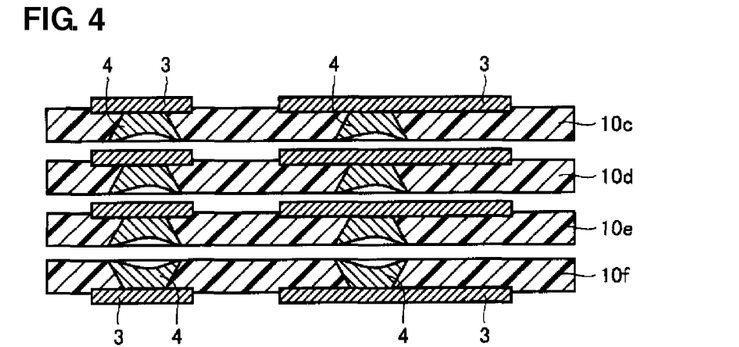
FIG. 4 is an explanatory view of a state in which resin films are stacked.
Figure 5:
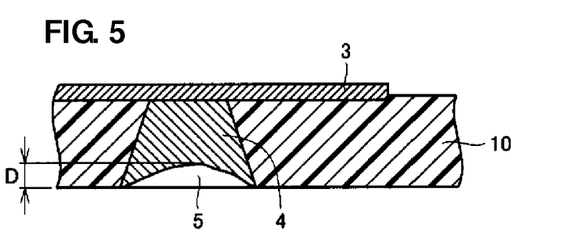
FIG. 5 is an explanatory view of a state in which the conductive portion is recessed.

Illustrating the recess at the exposed surface of the conductive portion 4 in an exaggerated manner, the resin films 10 are stacked and press-bonded, for example, as shown in FIG. 4. One of the resin films shown in FIG. 4 is a resin film 10, and a single conductive portion 4 included in the resin film 10 is considered. The thickness of each resin film ranges from about 25 μm to about 50 μm, for example, when the resin film is thin. The thickness of the conductive pattern 3 ranges from about 10 μm to about 20 μm, for example. Referring to FIG. 5, a depth D by which the conductive portion 4 sinks at the exit side of the through hole 5 is about 10 μm, for example.

The material of the resin film, or more particularly, thermoplastic resin becomes elasto-plastic, and flows in the horizontal direction while being slightly shrunk in the thickness direction by the heat and pressure during press-bonding. The thermoplastic resin preferably is, for example, liquid crystal polymer (LCP) resin, polyether ether ketone (PEEK) resin, polyether imide (PEI) resin, or polyimide (PI) resin.

Figure 6:
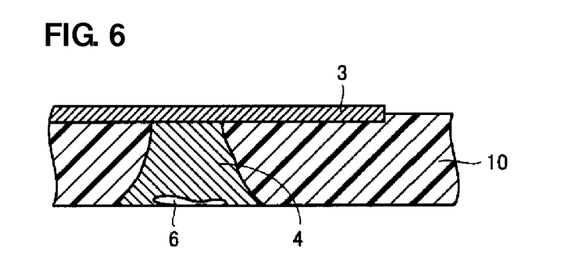
FIG. 6 is an explanatory view of a state in which the recess of the conductive portion is deformed.

When the thermoplastic resin in the elasto-plastic state flows in the horizontal direction while the thermoplastic resin is slightly shrunk in the thickness direction, copper foil defining the conductive pattern 3 is buried into the thermoplastic resin. Meanwhile, the conductive portion 4 is compressed in the horizontal direction by the fluidized thermoplastic resin, and is narrowed inward. Consequently, the recess of the conductive portion 4 shown in FIG. 5 is reduced in size as shown in FIG. 6, and becomes a gap 6 at a central portion. If the gap 6 of the conductive portion 4 faces and comes into contact with the conductive pattern 3 during stacking, i.e., if the gap 6 is present at any interface among the resin films 10c, 10d, and 10e in FIG. 4, the conductive pattern 3 comes into contact with the recess of the conductive portion 4, and pushes and eliminates the gap 6.

Figure 7:
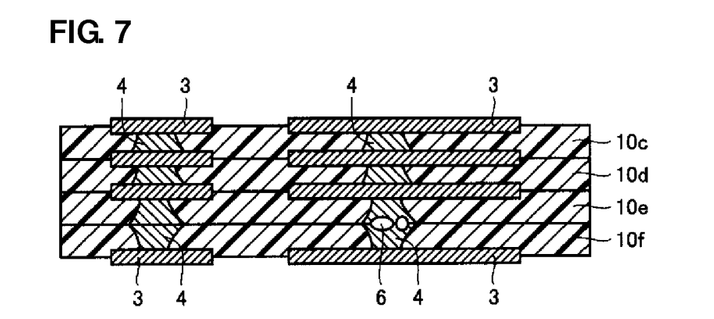
FIG. 7 is a cross-sectional view of a state in which a gap is trapped in the multilayer substrate.

However, if the gap 6 of the conductive portion 4 does not come into contact with the conductive pattern 3 during stacking, but directly faces and comes into contact with the conductive portion 4 of the other resin films, i.e., if the gap 6 is present between the resin films 10e and 10f in FIG. 4, the conductive pattern 3 is not present between the conductive portions 4 and, thus, the gap 6 is not eliminated. Accordingly, the gap 6 is trapped and remains in the multilayer substrate as shown in FIG. 7.

The remaining gap 6 may occasionally cause a conduction failure. When the multilayer substrate is mounted on the motherboard by soldering, reflowing is performed. When the multilayer substrate is exposed to high temperatures during reflowing, the gap 6 trapped inside may be expanded and ruptured, and may cause a failure. During wet plating of the multilayer substrate, a plating solution may enter the gap 6, the plating solution may oxidize or dissolve the conductive material or the copper foil defining the conductive pattern 3, and thus, a failure may occur.

At the connection position between the conductive portions 4 of a contact hole, the area that contributes to electrical connection decreases by the amount of the gap 6. When used with a high frequency, the conduction resistance increases and characteristics may be deteriorated thereby.

The inventors of the present invention have discovered that the gap remaining in the multilayer substrate causes the connection failure between the conductive portions of the respective layers at the interface at which the resin layers are arranged in the mutually inverted stacking directions and are in contact with each other. Thus, the inventors have developed preferred embodiments of the present invention.

First Preferred Embodiment

A multilayer substrate according to a first preferred embodiment of the present invention is described with reference to FIG. 8. A multilayer substrate 101 according to this preferred embodiment preferably includes a plurality of stacked thermoplastic resin layers 15c, 15d, 15e, and 15f each including an in-plane conductive pattern 13 provided on one of principal surfaces and an interlayer conductive portion 14 provided to penetrate through the thermoplastic resin layer in the thickness direction. The plurality of thermoplastic resin layers 15c, 15d, 15e, and 15f include first thermoplastic resin layers 15c, 15d, and 15e, and a second thermoplastic resin layer 15f the stacking direction of which is inverted with respect to the stacking direction of the first thermoplastic resin layers 15c, 15d, and 15e. The second thermoplastic resin layer 15f is preferably thicker than the first thermoplastic resin layers 15c, 15d, and 15e. One of the ends in the thickness direction of the interlayer conductive portion 14 provided at the second thermoplastic resin layer 15f is connected with the interlayer conductive portion 14 of the thermoplastic resin layer 15e adjacent to the second thermoplastic resin layer 15f in the thickness direction such that the in-plane conductive pattern 13 is not interposed therebetween.

One of the advantages provided by the multilayer substrate according to this preferred embodiment is described below.

Figure 9:
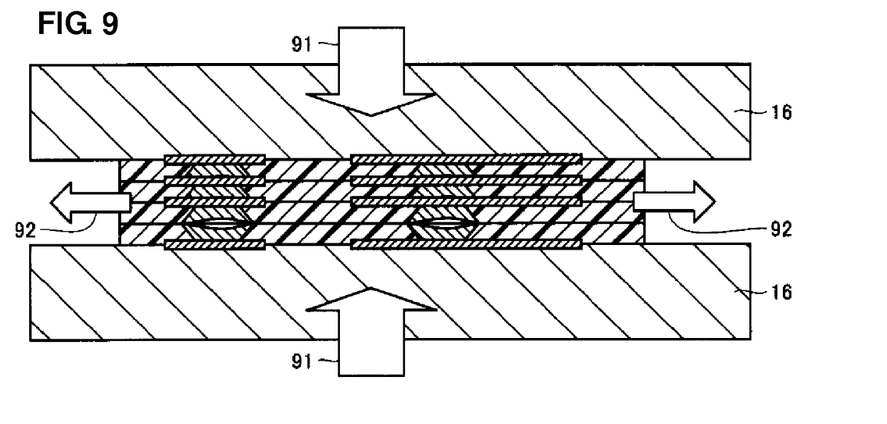
FIG. 9 is an explanatory view of press-bonding for fabricating the multilayer substrate according to a first preferred embodiment of the present invention.
Figure 10:
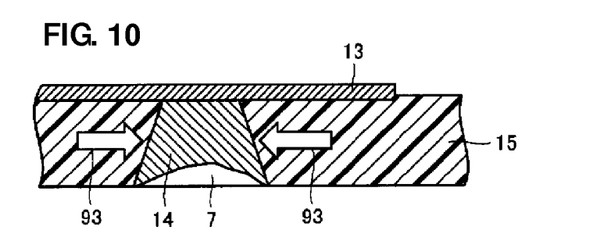
FIG. 10 is a partially enlarged cross-sectional view of a single thermoplastic resin layer included in a stack during press-bonding.
Figure 11:
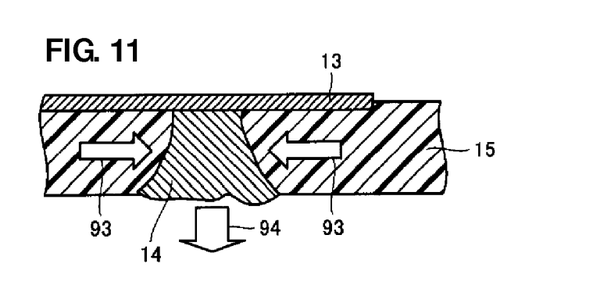
FIG. 11 is an explanatory view of a state in which an interlayer conductive portion protrudes.

In general, press-bonding for fabricating a multilayer substrate is performed such that hot plates 16 are arranged above and below stacked thermoplastic resin layers as shown in FIG. 9. To uniformly conduct heat, the hot plates 16 are made of metal having a high thermal conductivity and a high flatness. When pressure is applied in directions indicated by arrows 91, the thermoplastic resin layers tend to spread in the horizontal direction, i.e., in directions indicated by arrows 92. At this time, if the thicknesses of the thermoplastic resin layers are large, the amount of flowing resin increases. FIG. 10 illustrates a single thermoplastic resin layer 15 included in the stack during press-bonding. If the thickness of the thermoplastic resin layer 15 is large, the amount of resin flowing from the outside to the inside of the interlayer conductive portion 14 in a via hole increases, i.e., the amount of flowing resin so as to compress the interlayer conductive portion 14 in directions indicated by arrows 93 increases. Accordingly, the via hole itself is narrowed inward. Thus, the interlayer conductive portion 14 is pushed out to the exit of the via hole, resulting in that the gap 6 shown in FIG. 6 is eliminated. The interlayer conductive portion 14 may pass through the exit of the via hole and may protrude in a direction indicated by an arrow 94 as shown in FIG. 11 depending on the manufacturing conditions. In actuality, a via hole of the thermoplastic resin layer 15e adjacent to the second thermoplastic resin layer 15f is arranged to face the interlayer conductive portion 14 of the second thermoplastic resin layer 15f having the relatively large thickness in the multilayer substrate 101, at a position to which the interlayer conductive portion 14 of the second thermoplastic resin layer 15e tends to be pushed out. The interlayer conductive portion of the thermoplastic resin layer 15e tends to be pushed out in the facing direction. Thus, the interlayer conductive portions acting in directions in which the interlayer conductive portions are pushed out collide with each other, and closely contact each other. Thus the gap 6 at the interface becomes very small or is eliminated.

With this action, the gap at the interface at which the resin layers are arranged in the mutually inverted stacking directions and are in contact with each other can be significantly reduced or eliminated. Accordingly, with this preferred embodiment, the occurrence of a connection failure is reduced between the conductive portions of the respective resin layers at the interface at which the resin layers are arranged in the mutually inverted stacking directions and are in contact with each other. This advantage noticeably appears as the thickness of the thermoplastic resin layer increases. Accordingly, the second thermoplastic resin layer preferably has a thickness that is about 1.5 to about 5 times the thickness of the first thermoplastic resin layer.

The gap can be reduced or eliminated at the interface at which the resin layers are arranged in the mutually inverted stacking direction and are in contact with each other, and at the other interfaces by increasing the thickness of each thermoplastic resin layer. Specifically, by increasing the thickness of the thermoplastic resin layer having the interlayer conductive portion 14 that is connected with the in-plane conductive pattern 13, the gap at the interface between the in-plane conductive pattern 13 and the facing interlayer conductive portion 14 can be reduced or eliminated.

In the multilayer substrate according to this preferred embodiment, the occurrence of a connection failure at the interface at which the resin layers are arranged in the mutually inverted stacking direction and are in contact with each other is reduced, and also the conduction resistance is reduced. Accordingly, the high-frequency property is significantly improved. In addition, the gap is not ruptured during reflowing. Further, since the gap is at least substantially eliminated, the plating solution for wet soldering does not enter the gap. Accordingly, reliability is improved.

It is to be noted that the number of stacked thermoplastic resin layers is preferably four in this preferred embodiment. However, the number is not limited to four. The number of stacked resin layers may be any suitable number.

The adjacent thermoplastic resin layer 15e is one of the first thermoplastic resin layers, i.e., a thin layer. However, the "adjacent thermoplastic resin layer" is not limited to "one of the first thermoplastic resin layers." The adjacent thermoplastic resin layer may be thick like the second thermoplastic resin layer.

Figure 12:
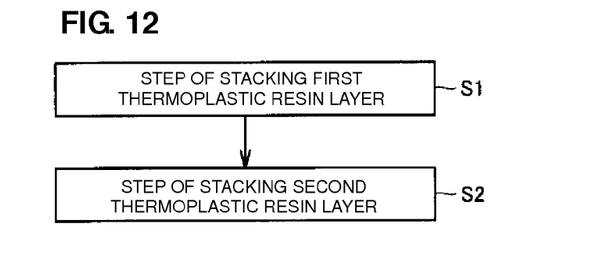
FIG. 12 is a flowchart of a method of manufacturing the multilayer substrate according to the first preferred embodiment of the present invention.

FIG. 12 illustrates a flowchart for a method of manufacturing a multilayer substrate according to a preferred embodiment of the present invention. The method of manufacturing the multilayer substrate according to this preferred embodiment is a method of manufacturing a multilayer substrate preferably including a plurality of stacked thermoplastic resin layers each including an in-plane conductive pattern provided on one of principal surfaces and an interlayer conductive portion provided to penetrate through the thermoplastic resin layer in the thickness direction. The plurality of thermoplastic resin layers include a first thermoplastic resin layer and a second thermoplastic resin layer being thicker than the first thermoplastic resin layer. The method preferably includes a step S1 of stacking the first thermoplastic resin layer, and a step S2 of stacking the second thermoplastic resin layer such that the stacking direction of the second thermoplastic resin layer is inverted with respect to the stacking direction of the first thermoplastic resin layer. One of the ends in the thickness direction of the interlayer conductive portion provided at the second thermoplastic resin layer is connected with the interlayer conductive portion of the thermoplastic resin layer adjacent to the second thermoplastic resin layer in the thickness direction such that the in-plane conductive pattern is not interposed therebetween.

With such a manufacturing method, the occurrence of a connection failure is significantly reduced between the conductive portions of the respective resin layers at the interface at which the resin layers are arranged in the mutually inverted stacking directions and are in contact with each other.

Figure 8:
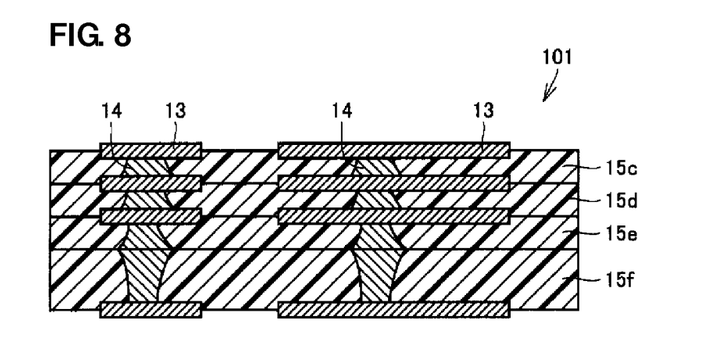
FIG. 8 is a cross-sectional view of a multilayer substrate according to a first preferred embodiment of the present invention.

In the example shown in FIG. 8, the lowermost layer is the second thermoplastic resin layer and the other layers are the first thermoplastic resin layers. When it is assumed that the four stacked thermoplastic resin layers are successively denoted as L1 to L4 from the lower side, the resin layers of the example in FIG. 8 are expressed as shown in FIG. 13.

Figure 13:
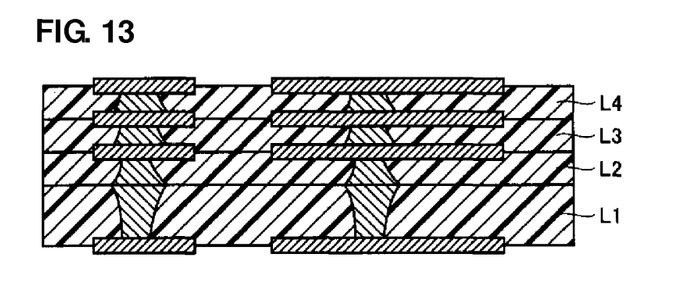
FIG. 13 is a cross-sectional view of a first example of the multilayer substrate according to a preferred embodiment of the present invention.

When it is assumed that the layer the stacking direction of which is merely inverted is called the "inversion layer," in an example shown in FIG. 13, a layer L1 that is the lowermost layer corresponds to the inversion layer. However, the position of the inversion layer is not limited to the lowermost layer in the multilayer substrate according to preferred embodiments of the present invention. The inversion layer may be the uppermost layer or an intermediate layer. Also, the number of inversion layers is not limited to one in the multilayer substrate. The number of inversion layers may be any suitable number. In this case, all of the inversion layers are not required to be the second thermoplastic resin layers.

The first thermoplastic resin layer is any of layers stacked to form a multilayer substrate. In contrast, the second thermoplastic resin layer preferably satisfies all three requirements described below.

(1) The stacking direction of the second thermoplastic resin layer is inverted with respect to the stacking direction of the first thermoplastic resin layer.

(2) The second thermoplastic resin layer is thicker than the first thermoplastic resin layer.

(3) One of the ends in the thickness direction of the interlayer conductive portion of the second thermoplastic resin layer is connected with the interlayer conductive portion of either of thermoplastic resin layers adjacent to the second thermoplastic resin layer in the thickness direction such that the in-plane conductive pattern is not interposed therebetween.

The multilayer substrate according to a preferred embodiment of the present invention preferably includes the plurality of thermoplastic resin layers which define the multilayer substrate and include the first and second thermoplastic resin layers that satisfy the requirements described above. The multilayer substrate may preferably include a thermoplastic resin layer that is none of the first and second thermoplastic resin layers. A modification of the multilayer substrate according to this preferred embodiment is described below in further detail with reference to FIGS. 14 to 16 each illustrating a multilayer substrate in a manner similar to FIG. 13. Multilayer substrates shown in FIGS. 13 to 16 are the multilayer substrates according to various preferred embodiments of the present invention.

Figure 14:
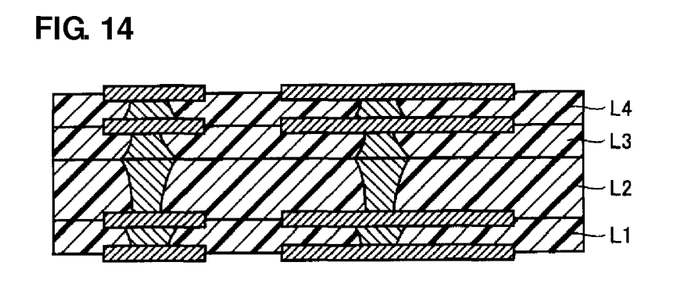
FIG. 14 is a cross-sectional view of a second example of the multilayer substrate according to a preferred embodiment of the present invention.

In an example in FIG. 14, L1 and L2 are inversion layers. L3 and L4 correspond to the first thermoplastic resin layers, and L2 corresponds to the second thermoplastic resin layer. L1 is the inversion layer, but is not thick. L1 does not correspond to the second thermoplastic resin layer.

Figure 15:
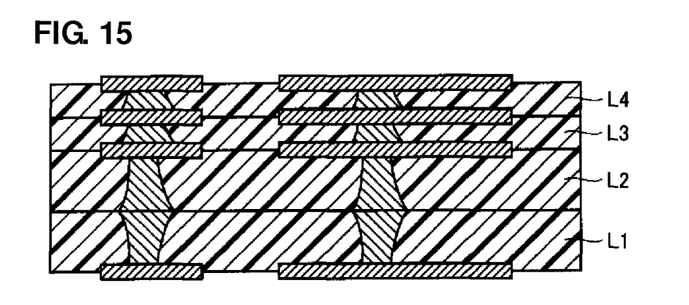
FIG. 15 is a cross-sectional view of a third example of the multilayer substrate according to a preferred embodiment of the present invention.

In an example in FIG. 15, L1 is an inversion layer. L3 and L4 correspond to the first thermoplastic resin layers, and L1 corresponds to the second thermoplastic resin layer. In this case, the second thermoplastic resin layer is not adjacent to the first thermoplastic resin layer in the thickness direction. L2 is not an inversion layer, but is thick. L2 does not correspond to the second thermoplastic resin layer.

Figure 16:
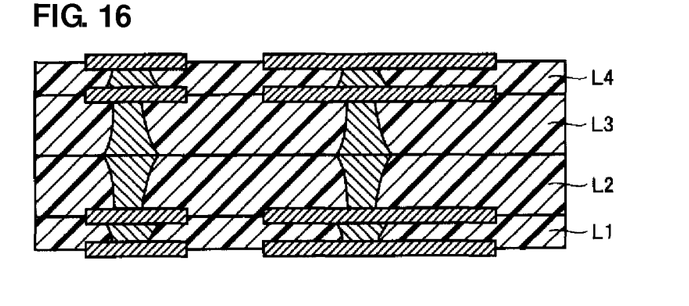
FIG. 16 is a cross-sectional view of a fourth example of the multilayer substrate according to a preferred embodiment of the present invention.

In an example in FIG. 16, L1 and L2 are inversion layers. L4 corresponds to the first thermoplastic resin layer, and L2 corresponds to the second thermoplastic resin layer. In this case, the second thermoplastic resin layer is not adjacent to the first thermoplastic resin layer in the thickness direction. L3 is not an inversion layer, but is thick. L3 does not correspond to the second thermoplastic resin layer.

For the multilayer substrate according to this preferred embodiment, the second thermoplastic resin layer is preferably arranged at the uppermost layer or the lowermost layer. The examples shown in FIGS. 13 and 15 correspond to this arrangement.

For the method of manufacturing the multilayer substrate according to this preferred embodiment, the second thermoplastic resin layer is preferably arranged at the uppermost layer or the lowermost layer.

Arranging the second thermoplastic resin layer at the uppermost layer or the lowermost layer ensures that the thermoplastic resin layer at the uppermost layer or the lowermost layer is thick.

The in-plane conductive pattern 13 preferably is formed of copper foil, for example. The in-plane conductive pattern 13 at the uppermost layer or the lowermost layer, i.e., the in-plane conductive pattern 13 that is exposed as the upper or lower surface of the multilayer substrate is typically configured to have a larger surface roughness than the surface roughness of the in-plane conductive pattern 13 in the multilayer substrate, in order to increase bonding strength between the copper foil and the resin layer.

Since the surface mount device (SMD) and the integrated circuit (IC) are mounted on the upper surface (referred to as "front surface") of the multilayer substrate by soldering, for example, bonding strength that is strong enough to resist shrinkage stress of solder is required between the copper foil and the resin layer. The main material of SMD is typically ceramic, for example. The main material of IC is Si, for example. These materials have thermal expansion coefficients different from that of the resin layer. A thermal stress is generated during heat cycle. Thus, high bonding strength that is enough to resist the heat stress is required between the copper foil and the resin layer.

Since the lower surface (referred to as "back surface") of the multilayer substrate is mounted on the motherboard by soldering, for example, high bonding strength is required in order to increase resistance to heat stress during the heat cycle and resistance to drop impact stress.

For easy soldering, Ni/Sn plating, Ni/solder plating, or Ni/Au plating, for example, is preferably applied on the copper foil on the upper and lower surfaces of the multilayer substrate. Ni plating is in contact with the copper foil, and thus, shrinkage stress during plating becomes large. To resist this, the bonding strength between the copper foil and the resin layer is required to be increased.

Figure 17:
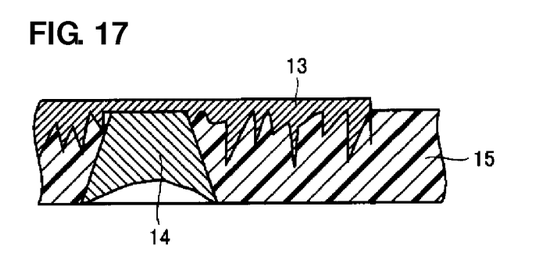
FIG. 17 is a cross-sectional view of an area near the upper or lower surface of the multilayer substrate.

The surface roughness of the copper foil that is preferably roughened to increase the bonding strength at the upper and lower surfaces of the multilayer substrate is preferably about 10 μm at the maximum, for example. FIG. 17 illustrates such an example. If the thickness of the thermoplastic resin layer 15 is, for example, about 25 μm, the surface projections and depressions of the copper foil of the in-plane conductive pattern 13 dig into the thermoplastic resin layer 15 by about half the thickness of the thermoplastic resin layer 15. The volume of resin of the thermoplastic resin layer 15 at the uppermost layer or the lowermost layer of the multilayer substrate is significantly less than the volume of resin of the thermoplastic resin layer 15 at the inner layer of the multilayer substrate. Therefore, the volume of resin (see FIGS. 9 to 11) flowing to compress the via hole inward is relatively small. To obtain the advantages of preferred embodiments of the present invention, the thermoplastic resin layer 15 located at the uppermost layer or the lowermost layer is preferably thick.

In contrast, the copper foil defining the in-plane conductive pattern 13 disposed inside the multilayer substrate preferably has as small of a surface roughness as possible in order to allow a signal to easily pass through the surface of the copper foil by the skin effect if a high frequency is used.

As described above, the thermoplastic resin layer 15 at the uppermost layer or the lowermost layer is preferably thick. The examples in FIGS. 13 and 15 are more preferable than the examples in FIGS. 14 and 16 from among the modifications shown in FIGS. 13 to 16 of the multilayer substrate according to this preferred embodiment. In the example in FIG. 13, the total thickness of the multilayer substrate is decreased as much as possible and the thickness of the thermoplastic resin layer at the lowermost layer is increased to serve as the second thermoplastic resin layer. Thus, the example in FIG. 13 is preferable. If the total thickness of the multilayer substrate does not need to be decreased, the example in FIG. 15 can provide the most apparent advantage. In other words, the example in FIG. 15 from among the examples in FIGS. 13 to 16 can most reliably reduce the occurrence of a connection failure between the conductive portions of the respective resin layers at the interface at which the resin layers are arranged in the mutually inverted stacking directions and are in contact with each other.

Figure 18:
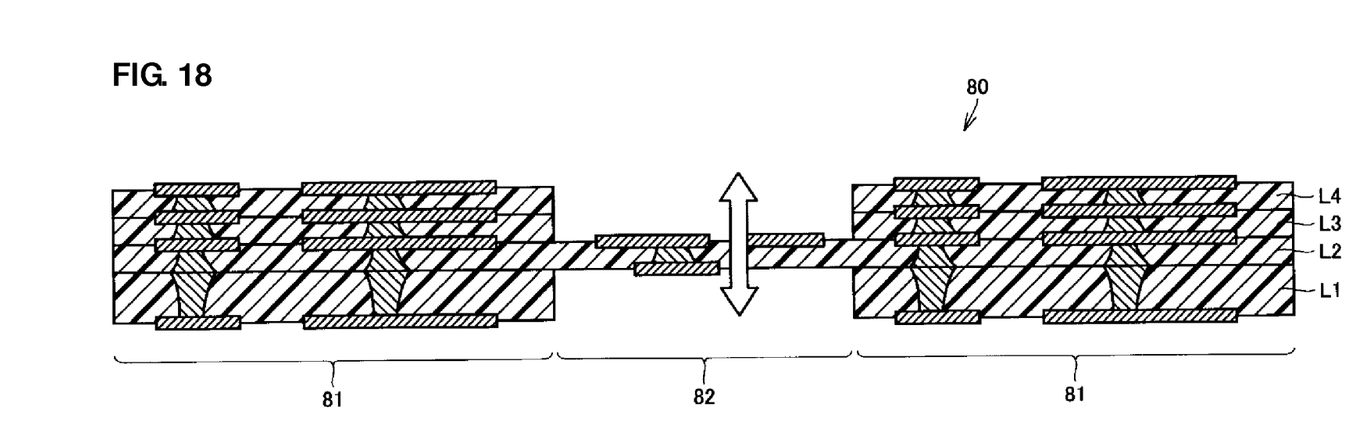
FIG. 18 is a cross-sectional view of an example of a rigid-flexible substrate according to a preferred embodiment of the present invention.

A structure, in which two multilayer substrates including multiple layers to increase thicknesses and, thus, being rigid are connected with each other by a section including a reduced number of layers, is generally called "rigid-flexible substrate." Preferred embodiments of the present invention can be also applied to the rigid-flexible substrate. FIG. 18 illustrates an example. A rigid-flexible substrate 80 preferably includes rigid sections 81 and a flexible section 82. Each of the rigid sections 81 preferably includes four thermoplastic resin layers L1 to L4 in total, thereby being rigid. The flexible section 82 preferably includes only a single layer that is the thermoplastic resin layer L2. Thus, the flexible section 82 is relatively easily bent. The layer L2 of the flexible section 82 is continued and extends from the layer L2 included in the rigid sections 81. The example shown in FIG. 18 is the rigid-flexible substrate formed by extending the layer L2 of the example shown in FIG. 13. Alternatively, any of the examples in FIGS. 14 to 16 may be formed as a rigid-flexible substrate by extending any of the layers L1 to L4.

The example described here includes the rigid sections including the four layers L1 to L4 and the flexible section including the single layer L2. However, the number of thermoplastic resin layers included in the rigid sections may be any suitable number other than four, and the number of thermoplastic resin layers included in the flexible section may be any suitable number other than one.

In the multilayer substrate according to this preferred embodiment, the in-plane conducive pattern 13 is preferably metal foil, for example, and the interlayer conductive portion 14 is preferably formed by hardening or low-temperature sintering metal paste filled in a via conductive hole, i.e., a via hole. In the method of manufacturing the multilayer substrate according to this preferred embodiment, the in-plane conducive pattern 13 is preferably metal foil, for example, and the interlayer conductive portion 14 is preferably formed by hardening or low-temperature sintering metal paste filled in a via conductive hole.

This configuration facilitates fabrication of the multilayer substrate. Also, since the metal foil defines the in-plane conductive pattern, the in-plane conductive pattern can be in close contact with the resin layer.

Second Preferred Embodiment

Figure 19:
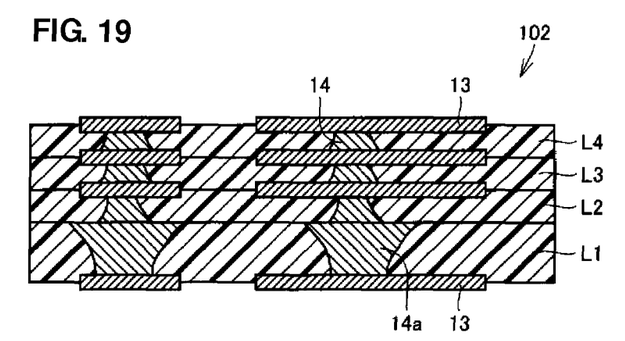
FIG. 19 is a cross-sectional view of a multilayer substrate according to a second preferred embodiment of the present invention.

A multilayer substrate 102 according to a second preferred embodiment of the present invention is described below with reference to FIG. 19. The basic configuration of the multilayer substrate according to the second preferred embodiment is similar to that described in the first preferred embodiment. In the multilayer substrate 102 according to this preferred embodiment, an interlayer conductive portion 14a provided at the second thermoplastic resin layer preferably has a larger diameter than the diameter of the interlayer conductive portion 14 provided at the first thermoplastic resin layer. As shown in FIG. 19, L2 to L4 correspond to the first thermoplastic resin layers, and L1 corresponds to the second thermoplastic resin layer. The interlayer conductive portion 14a of L1 that is the second thermoplastic resin layer preferably has the larger diameter than the diameters of the interlayer conductive portions 14 of L2 to L4 that are the first thermoplastic resin layers. Also in this preferred embodiment, the second thermoplastic resin layer is preferably thicker than the first thermoplastic resin layer similarly to the configuration described in the first preferred embodiment.

One of the advantages provided by the multilayer substrate according to this preferred embodiment is described below. In this preferred embodiment, the advantage described in the first preferred embodiment is obtained. In addition, an advantage is obtained for a shift caused by thermal deformation. This point is described below.

The resin layer is provided as a resin film before stacking. The resin film is subjected to various thermal history until the resin film is finished to define the multilayer substrate. For example, when the resin film is bonded to the copper foil that becomes the in-plane conductive pattern, the temperature is about 300° C. When a photoresist film is attached for patterning the copper foil, the temperature is about 100° C. During drying after etching of the copper foil, the temperature is about 100° C. During drying after the inside of the via hole is filled with the conductive member, the temperature is in a range from about 100° C. to about 150° C. During press-bonding of the stack, the temperature is in a range from about 250° C. to about 300° C. The resin film is thermally deformed in the process of the thermal history. At the same time, the metal paste of the interlayer conductive portion is hardened or sintered at low temperatures, and is bonded to the in-plane conductive pattern.

Figure 20:
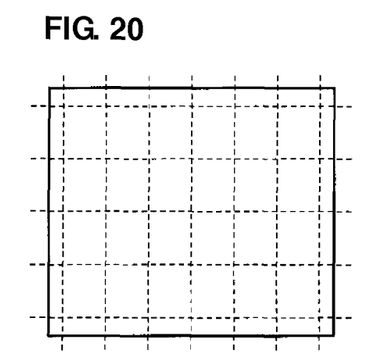
FIG. 20 is an explanatory view of a first form of thermal deformation of a resin film.
Figure 21:
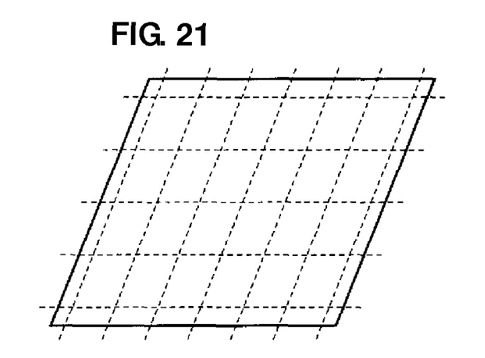
FIG. 21 is an explanatory view of a second form of the thermal deformation of the resin film.
Figure 22:
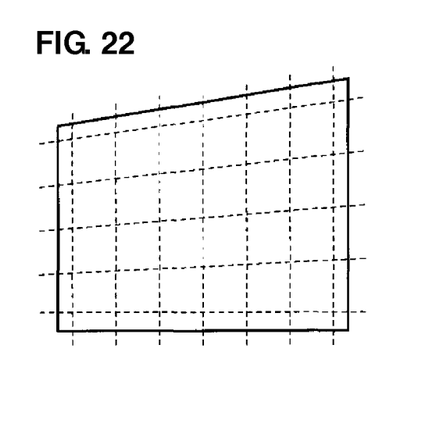
FIG. 22 is an explanatory view of a third form of the thermal deformation of the resin film.

An expected form of thermal deformation of an individual resin film may be a form in which the resin film is expanded or contracted isotropically as shown in FIG. 20, a form in which the resin film is deformed in a parallelogram as shown in FIG. 21, and a form in which the resin film is deformed in the other quadrangles as shown in FIG. 22. Herein, it is assumed that via holes are present at intersection points on a grating indicated by broken lines, and it is expected that an inverted resin film is overlaid on a non-inverted resin film.

In the case of the isotropic expansion or contraction as shown in FIG. 20, the positions of the intersection points at the respective layers are not shifted with respect each other even when the resin layer is inverted and overlaid. However, in the case of the deformation shown in FIG. 21, the intersection points are shifted from each other when the resin layer is inverted and overlaid. If a particular intersection point is shifted by $+x$ as the result of deformation from the position before the deformation, the shift of the intersection point at the inverted layer appears as $-x$. When the inverted layer is overlaid on the non-inverted layer, the shift between the corresponding intersection points becomes $(+x)-(-x)=+2x$. That is, the shift amount of the intersection points between the two overlaid layers is twice the displacement by which each intersection point is shifted from the initial position. For example, in a case in which the via hole diameter is about 100 μm, if a certain intersection point is shifted from the initial position by about 50 μm as the result of the deformation as shown in FIG. 21, the shift between the inverted and overlaid layers is about 100 μm that is twice the value of about 50 μm. The shift is substantially as large as the via hole diameter. The via holes may not be overlaid on each other. In other words, a condition that causes corresponding via holes at two inverted and overlaid layers to be aligned with each other even by only slightly is as follows:

$$\text{shift amount } x<50 \text{ μm.}$$

As described in this preferred embodiment, an effective countermeasure is that the diameter of the interlayer conductive portion at the second thermoplastic resin layer that is to be inverted is larger than the diameter of the interlayer conductive portion provided at the first thermoplastic resin layer. For example, if the diameter of the interlayer conductive portion at the first thermoplastic resin layer is about 100 μm and the diameter of the interlayer conductive portion at the second thermoplastic resin layer is about 200 μm, and if the first thermoplastic resin layer is directly overlaid on the second thermoplastic resin layer, a condition that causes corresponding via holes in the two inverted and overlaid layers to be aligned with each other even by only slightly is as follows:

$$\text{shift amount } x<75 \text{ μm } (=(200/2+100/2)/2)$$

According to this preferred embodiment, the allowable range of the shift amount is increased in this manner.

In the method of manufacturing the multilayer substrate according to this preferred embodiment, the diameter of the interlayer conductive portion formed at the second thermoplastic resin layer is larger than the diameter of the interlayer conductive portion formed at the first thermoplastic resin layer.

With such a manufacturing method, the occurrence of a connection failure is reduced between the conductive portions of the respective resin layers at the interface at which the resin layers are arranged in the mutually inverted stacking directions and are in contact with each other.

Figure 23:
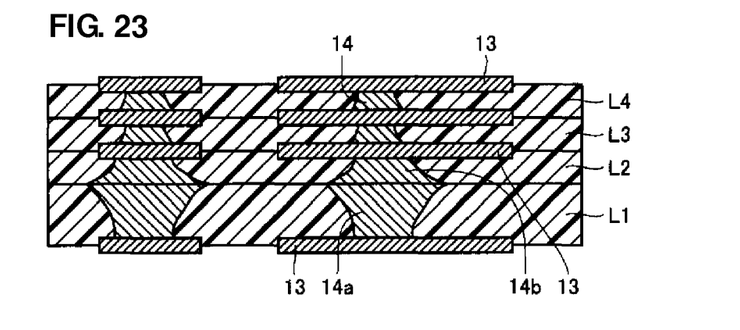
FIG. 23 is a cross-sectional view of a modification of the multilayer substrate according to the second preferred embodiment of the present invention.

As shown in FIG. 23, a configuration in which the diameter of an interlayer conductive portion 14b at a thermoplastic resin layer adjacent to the second thermoplastic resin layer is conceivable as a modification. If the diameter of the interlayer conductive portion 14a at the second thermoplastic resin layer is increased, and the diameter of the interlayer conductive portion 14b at the adjacent layer is increased, this is preferable because the allowable range of the shift amount can be further increased. In the example shown in FIG. 23, L3 and L4 correspond to the first thermoplastic resin layers, and L1 corresponds to the second thermoplastic resin layer. L2 does not correspond to the first thermoplastic resin layer.

A modification of the multilayer substrate according to this preferred embodiment is described in further detail with reference to FIGS. 24 to 31 each illustrating a multilayer substrate in a manner similar to FIG. 13. Multilayer substrates shown in FIGS. 24 to 31 are the multilayer substrates according to various preferred embodiments of the present invention.

Figure 24:
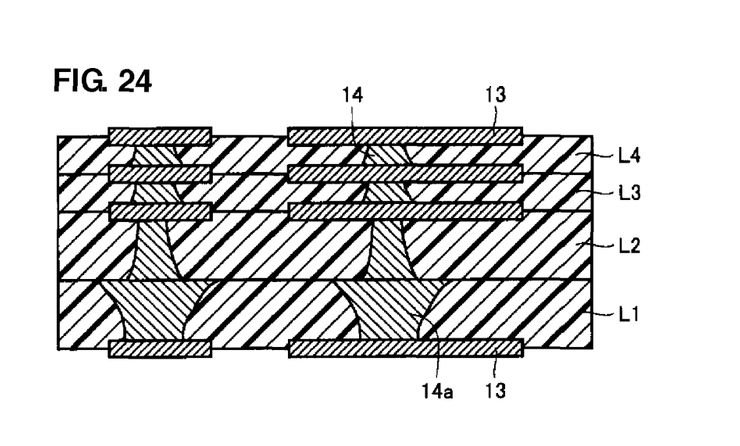
FIG. 24 is a cross-sectional view of a first example of the multilayer substrate according to a preferred embodiment of the present invention, in which the thickness of a thermoplastic resin layer adjacent to an inversion layer in the thickness direction is also increased.
Figure 25:
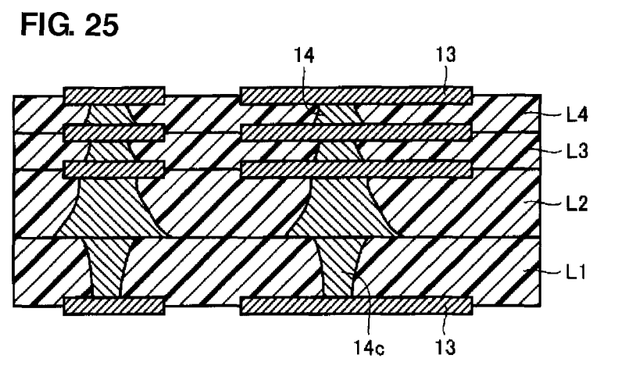
FIG. 25 is a cross-sectional view of a second example of the multilayer substrate according to a preferred embodiment of the present invention, in which the thickness of a thermoplastic resin layer adjacent to an inversion layer in the thickness direction is also increased.
Figure 26:
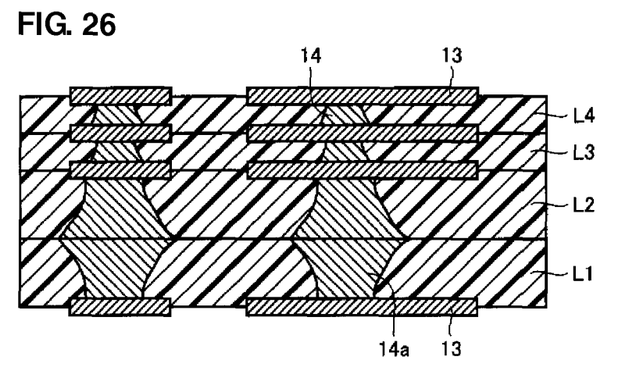
FIG. 26 is a cross-sectional view of a third example of the multilayer substrate according to a preferred embodiment of the present invention, in which the thickness of a thermoplastic resin layer adjacent to an inversion layer in the thickness direction is also increased.

In the examples shown in FIGS. 24 to 26, the thickness of the second thermoplastic resin layer is increased, and the thickness of a thermoplastic resin layer adjacent to the inverted layer in the thickness direction is increased. In any of the examples shown in FIGS. 24 to 26, L3 and L4 correspond to the first thermoplastic resin layers, and L1 corresponds to the second thermoplastic resin layer. According to preferred embodiments of the present invention, as shown in FIGS. 24 to 26, the diameter of the interlayer conductive portion of only one of the two layers of the second thermoplastic resin layer and the thermoplastic resin layer adjacent to the second thermoplastic resin layer may be preferably increased, or the diameters of the interlayer conductive portions at both the two layers may preferably be increased. In each of the examples in FIGS. 24 and 26, the diameter of the interlayer conductive portion 14a of the second thermoplastic resin layer is preferably larger than the diameter of the interlayer conductive portion 14 of the first thermoplastic resin layer according to the second preferred embodiment. In the example in FIG. 25, the diameter of an interlayer conductive portion 14c of the second thermoplastic resin layer is preferably not larger than the diameter of the interlayer conductive portion 14 of the first thermoplastic resin layer. Thus, this example does not correspond to the configuration described in the second preferred embodiment. However, this example corresponds to the configuration described in the first preferred embodiment.

Figure 27:
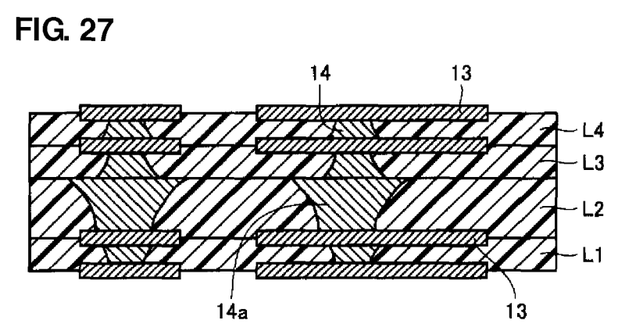
FIG. 27 is a cross-sectional view of a first example of the multilayer substrate according to a preferred embodiment of the present invention, in which a second thermoplastic resin layer is positioned as an intermediate layer.
Figure 28:
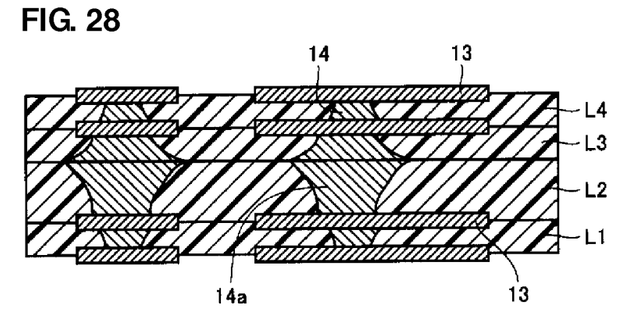
FIG. 28 is a cross-sectional view of a second example of the multilayer substrate according to a preferred embodiment of the present invention, in which a second thermoplastic resin layer is positioned as an intermediate layer.

Either of FIGS. 27 and 28 illustrates an example in which the second thermoplastic resin layer is not located at the lowermost layer but is located at an intermediate layer. In either of the examples shown in FIGS. 27 and 28, L3 and L4 correspond to the first thermoplastic resin layers, and L2 corresponds to the second thermoplastic resin layer.

Figure 29:
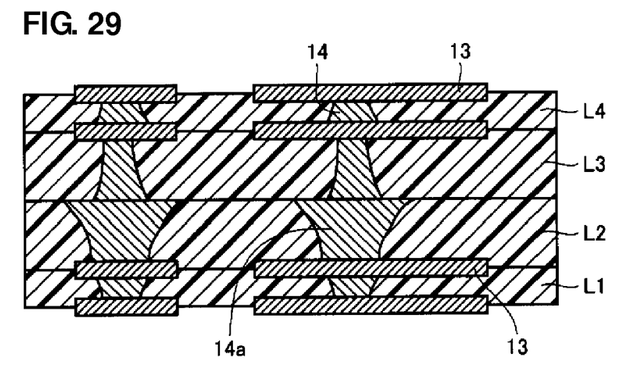
FIG. 29 is a cross-sectional view of a fourth example of the multilayer substrate according to a preferred embodiment of the present invention, in which the thickness of a thermoplastic resin layer adjacent to an inversion layer in the thickness direction is also increased.
Figure 30:
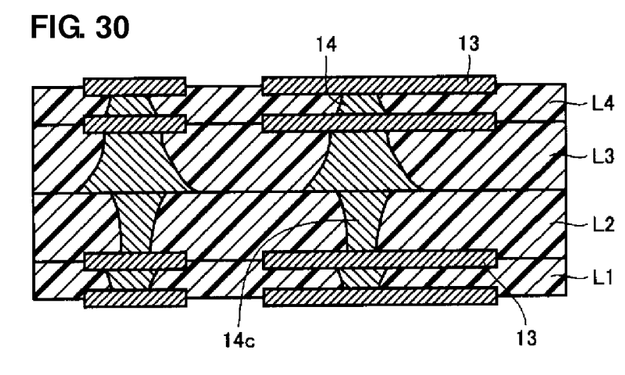
FIG. 30 is a cross-sectional view of a fifth example of the multilayer substrate according to a preferred embodiment of the present invention, in which the thickness of a thermoplastic resin layer adjacent to an inversion layer in the thickness direction is also increased.
Figure 31:
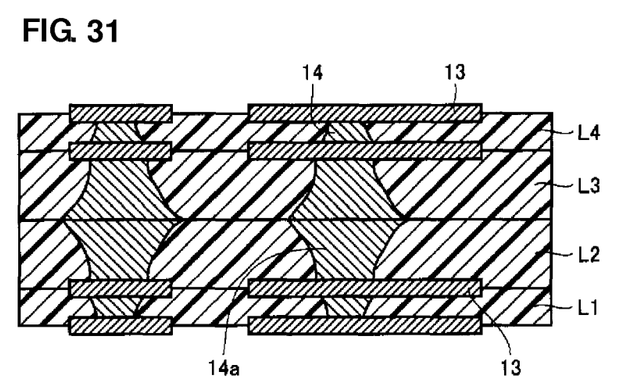
FIG. 31 is a cross-sectional view of a sixth example of the multilayer substrate according to a preferred embodiment of the present invention, in which the thickness of a thermoplastic resin layer adjacent to an inversion layer in the thickness direction is also increased.

Any of FIGS. 29 to 31 illustrates an example in which the structure provided at the lowermost layer and the second layer from the lowermost layer in any of FIGS. 24 to 26 is provided by intermediate layers. In any of the examples shown in FIGS. 29 to 31, L4 corresponds to the first thermoplastic resin layer, and L2 corresponds to the second thermoplastic resin layer. According to preferred embodiments of the present invention, as shown in FIGS. 29 to 31, the diameter of the interlayer conductive portion of only one of the two layers of the second thermoplastic resin layer and the thermoplastic resin layer adjacent to the second thermoplastic resin layer, which are present as the intermediate layers of the multilayer substrate, may be increased, or the diameters of the interlayer conductive portions of both the two layers may be increased.

Even with these modifications, the gap at the interface at which the resin layers are arranged in the mutually inverted stacking directions and are in contact with each other is reduced or eliminated. In addition, the allowable range of the shift amount by thermal deformation is increased.

In any of the above-described preferred embodiments, the multilayer substrate is preferably configured as a stack including a total of four thermoplastic resin layers L1 to L4 as precondition, for example. However, the number of thermoplastic resin layers of the multilayer substrate may be any suitable number other than four.

Preferred embodiments of the present invention can be applied to a multilayer substrate and a manufacturing method thereof, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
a plurality of stacked thermoplastic resin layers each including an in-plane conductive pattern provided on one principal surface thereof and an interlayer conductive portion arranged to penetrate through the thermoplastic resin layer in a thickness direction thereof; wherein
the plurality of stacked thermoplastic resin layers include a first thermoplastic resin layer and a second thermoplastic resin layer, a stacking direction of which is inverted with respect to a stacking direction of the first thermoplastic resin layer, the second thermoplastic resin layer being thicker than the first thermoplastic resin layer; and
one end in the thickness direction of the interlayer conductive portion provided in the second thermoplastic resin layer is connected with the interlayer conductive portion of the thermoplastic resin layer adjacent to the second thermoplastic resin layer in the thickness direction such that the in-plane conductive pattern is not interposed therebetween.

2. The multilayer substrate according to claim 1, wherein the second thermoplastic resin layer is arranged at an uppermost layer or a lowermost layer of the plurality of stacked thermoplastic resin layers.

3. The multilayer substrate according to claim 1, wherein the interlayer conductive portion provided in the second thermoplastic resin layer has a larger diameter than a diameter of the interlayer conductive portion provided in the first thermoplastic resin layer.

4. The multilayer substrate according to claim 1, wherein the interlayer conductive portion of the thermoplastic resin layer connected to the interlayer conductive portion of the second thermoplastic resin layer such that the in-plane conductive pattern is not interposed therebetween has a larger diameter than a diameter of the interlayer conductive portion provided in the first thermoplastic resin layer.

5. The multilayer substrate according to claim 1, wherein the thermoplastic resin layer connected with the interlayer conductive portion of the second thermoplastic resin layer such that the in-plane conductive pattern is not interposed therebetween is thicker than the first thermoplastic resin layer.

6. The multilayer substrate according to claim 1, wherein the in-plane conductive pattern includes a metal foil, and the interlayer conductive portion is made of a hardened or low-temperature sintered metal paste filled in a via conductor hole.

7. A method of manufacturing a multilayer substrate including a plurality of stacked thermoplastic resin layers each including an in-plane conductive pattern provided on one principal surface thereof and an interlayer conductive portion arranged to penetrate through the thermoplastic resin layer in a thickness direction thereof, wherein the plurality of stacked thermoplastic resin layers include a first thermoplastic resin layer and a second thermoplastic resin layer that is thicker than the first thermoplastic resin layer, the method comprising the steps of:
stacking the first thermoplastic resin layer; and
stacking the second thermoplastic resin layer such that a stacking direction of the second thermoplastic resin layer is inverted with respect to a stacking direction of the first thermoplastic resin layer; wherein
one end in the thickness direction of the interlayer conductive portion provided in the second thermoplastic resin layer is connected with the interlayer conductive portion of the thermoplastic resin layer adjacent to the second thermoplastic resin layer in the thickness direction such that the in-plane conductive pattern is not interposed therebetween.

8. The method of manufacturing the multilayer substrate according to claim 7, wherein the second thermoplastic resin layer is arranged at an uppermost layer or a lowermost layer of the plurality of stacked thermoplastic resin layers.

9. The method of manufacturing the multilayer substrate according to claim 7, wherein the interlayer conductive portion provided in the second thermoplastic resin layer has a larger diameter than a diameter of the interlayer conductive portion provided in the first thermoplastic resin layer.

10. The method of manufacturing the multilayer substrate according to claim 7, wherein the interlayer conductive portion of the thermoplastic resin layer connected to the interlayer conductive portion of the second thermoplastic resin layer such that the in-plane conductive pattern is not interposed therebetween has a larger diameter than a diameter of the interlayer conductive portion provided in the first thermoplastic resin layer.

11. The method of manufacturing the multilayer substrate according to claim 7, wherein the thermoplastic resin layer connected with the interlayer conductive portion of the second thermoplastic resin layer such that the in-plane conductive pattern is not interposed therebetween is thicker than the first thermoplastic resin layer.

12. The method of manufacturing the multilayer substrate according to claim 7, wherein the in-plane conductive pattern includes a metal foil, and the interlayer conductive portion is made of hardened or low-temperature sintered metal paste filled in a via conductor hole.

* * * * *